United States Patent [19]

Sato et al.

[11] Patent Number: 4,527,230
[45] Date of Patent: Jul. 2, 1985

[54] METHOD OF CONTROLLING A SET POINT

[75] Inventors: Keiichi Sato; Yoko Takeuchi, both of Tokyo; Midori Yanagisawa, Ibaragi, all of Japan

[73] Assignee: Sony/Tektronix Corporation, Tokyo, Japan

[21] Appl. No.: 518,581

[22] Filed: Jul. 29, 1983

[30] Foreign Application Priority Data

Aug. 18, 1982 [JP] Japan .................. 57-143081

[51] Int. Cl.$^3$ .................. G06F 3/03; G06F 15/20
[52] U.S. Cl. .................. 364/130; 340/347 P; 364/188
[58] Field of Search .............. 364/130, 188, 189, 190; 340/347 P, 354, 364, 365 R

[56] References Cited

U.S. PATENT DOCUMENTS

| 4,096,476 | 6/1978 | Toida | 340/347 P |
| 4,123,750 | 10/1978 | Leney et al. | 340/347 P |
| 4,139,889 | 2/1979 | Ingels | 340/347 P X |
| 4,194,184 | 3/1980 | Hartmann et al. | 340/347 P |
| 4,342,025 | 7/1982 | Spalti et al. | 340/347 P |

FOREIGN PATENT DOCUMENTS 1307017 2/1973 United Kingdom.

Primary Examiner—Joseph Ruggiero
Attorney, Agent, or Firm—George T. Noe

[57] ABSTRACT

A set point control method and apparatus for controlling many set points of an electronic apparatus by using a simple switch is disclosed. A switch condition is repeatedly detected, and a difference of the switch conditions is obtained when a former switch condition is different from the present switch condition. If a switch is a rotary digital switch for selecting one of a plurality of digital words, the difference is defined by the rotation direction of the switch and a difference of the former and present digital words. A memory stores a plurality of set information, and is addressed in accordance with the difference for controlling the set point of the electronic apparatus.

3 Claims, 5 Drawing Figures

| | |
|---|---|
| 0 | AUTO |
| 1 | .1μ |
| 2 | .2μ |
| 3 | .5μ |
| 4 | 1μ |
| 5 | 2μ |
| ⋮ | ⋮ |
| 19 | 50m |
| 20 | .1 |
| 21 | .2 |
| 22 | .5 |
| 23 | 1 |
| 24 | 5 |
| 25 | 10 |
| 26 | 20 |
| 27 | X-Y |

METHOD OF CONTROLLING A SET POINT

BACKGROUND OF THE INVENTION

The present invention relates to a method of controlling a set point of an electronic apparatus in accordance with one of a plurality of switch conditions.

Electronic apparatus with processing units such as microprocessors ($\mu$Ps) are increasingly popular. In the electronic apparatus, keyboards are widely used for controlling various kind of set points. One method of setting the various set points (values) is to push a desired key selected from a key matrix. Another method is to keep pushing a predetermined key for increasing or decreasing sequentially a number (set point), and to release the key when the number is set to a desired value. However, rotary switches or slide switches are easy to operate by comparison with the keyboards in electronic measurement instruments such as oscilloscopes and waveform memory apparatus (digital storage oscilloscopes). In conventional methods of controlling set points with the rotary switches and slide switches, each switch contact corresponds to each set point, or each combination of a plurality of switch contacts corresponds to each set point. Assuming that a number of the switch contacts to N (positive integer) in the conventional methods, a number of the set points is only N when each contact corresponds to each set point, and the number thereof is $2^N$ when each contact combination corresponds to each set point. Thus, a number of the switch contacts increases and the switches become complex and bulk as the number of the set points increases.

SUMMARY OF THE INVENTION

According to the present invention, a switch includes a plurality of contacts (switch elements) for obtaining a plurality of switch conditions (combination of on and off states of the switch elements). The combination of the on and off states may be a digital word, and the switch may be an N-bit digital switch. Set information for controlling a set point of an electronic apparatus is stored in a memory. When a power switch of the electronic apparatus is turned on, the switch (contact) condition of the switch is detected and a predetermined initial value is set. The memory is addressed in accordance with the initial value, and the addressed set information is transferred to the electronic apparatus for setting an initial set point. The switch contact condition is periodically monitored at predetermined intervals. When a present detected contact condition is different from a former detected contact condition, the switch is judged to be operated, i.e., a movable contact of the switch is rotated or slid. In this instance, a changing direction and a number of changing steps of the switch are detected or calculated in accordance with a difference between the present and the former contact conditions. A new memory address is selected in response to the detected changing direction and steps, so that the corresponding set information is applied to the electronic apparatus for a new set point. Since the set information is obtained in accordance with the difference between the present and former contact conditions, a large number of the set points can be selected with a little number of the switch contacts. However, the set point is kept to the maximum or minimum value, even if the switch is controlled over the maximum value or under the minimum value. These operations may be controlled by using a microprocessor system.

It is, therefore, an object of the present invention to provide an improved method which controls a set point of an electronic apparatus with a simple and compact hardware.

It is another object of the present invention to provide a set point control method which controls more set points by using less switch conditions.

It is a further object of the present invention to provide a set point control apparatus which controls many set points with a simple switch.

Other objects and advantages of the present invention will become apparent to those having ordinary skill in the art when taken in conjunction with the accompanying drawings.

DRAWINGS

DETAILED DESCRIPTION OF THE INVENTION

Figure 1:
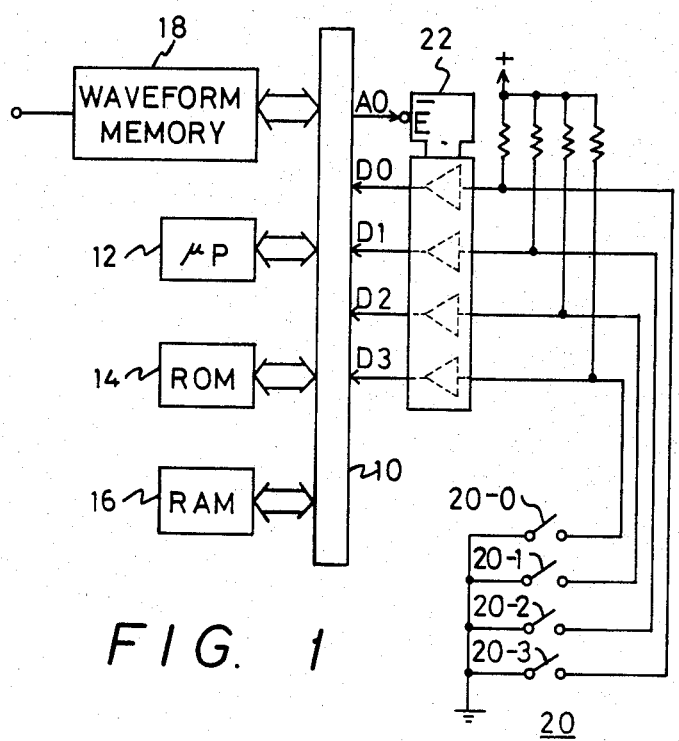
FIG. 1 shows a block diagram of an electronic apparatus including the present invention.

Referring to FIG. 1, there is shown a block diagram of an electronic apparatus including the present invention. A bus 10 consisting of data, address and control lines is connected to a microprocessor ($\mu$P) 12 such as type Z80A integrated circuit (IC), a read only memory (ROM) 14 for storing program for the microprocessor, a random access memory (RAM) 16 for operating as a temporary memory of the microprocessor, and an apparatus 18 such as a waveform memory apparatus. The Z80A is fully described in "Z80/Z80A CPU Technical Manual" and "Z8400/Z80 CPU Product Specification" published by Zilog. A four-bit digital switch 20 having four switch contacts 20-0 through 20-3 is used to select a set point and is connected to the bus 10 via a buffer 22 having an enabling function. The buffer 22 is an IC including four buffer circuits each receiving the output from each of the switch contacts, and the input terminals of the buffer circuits are connected to a positive voltage source +via resistors. The microprocessor 12 controls the waveform memory apparatus 18 and various set points by using the switch 20 in accordance with the program stored in the ROM 14.

Figure 2:
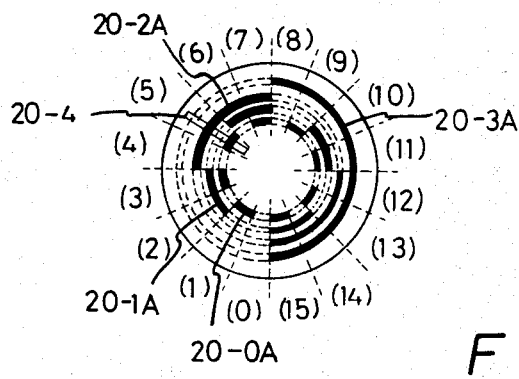
FIG. 2 shows a model of switch contacts of a switch 20 used in FIG. 1.

In the preferred embodiment, the switch 20 is a rotary switch, and the contact construction thereof is shown in FIG. 2. Fixed contacts 20-0A through 20-3A provided in arcs correspond to fixed contacts of the switch 20-0 through 20-3 (right hand circles) in FIG. 1, and they are connected to the buffer 22. A movable contact 20-4 crosses the fixed contacts 20-0A through 20-3A and slides on these contacts. The contact 20-4 corresponds to movable contacts of the switches 20-0 through 20-3 in FIG. 1 and is grounded. The switch contacts 20-0 and 20-3 are respectively a least significant bit (LSB) and a most significant bit (MSB) of the four-bit digital switch 20. Each detent position of the movable contact 20-4 corresponds to each four-bit word, and the contact selects one of sixteen word in one rotation. The words are shown with the decimal notation in FIG. 2.

Figures 3, 4B:
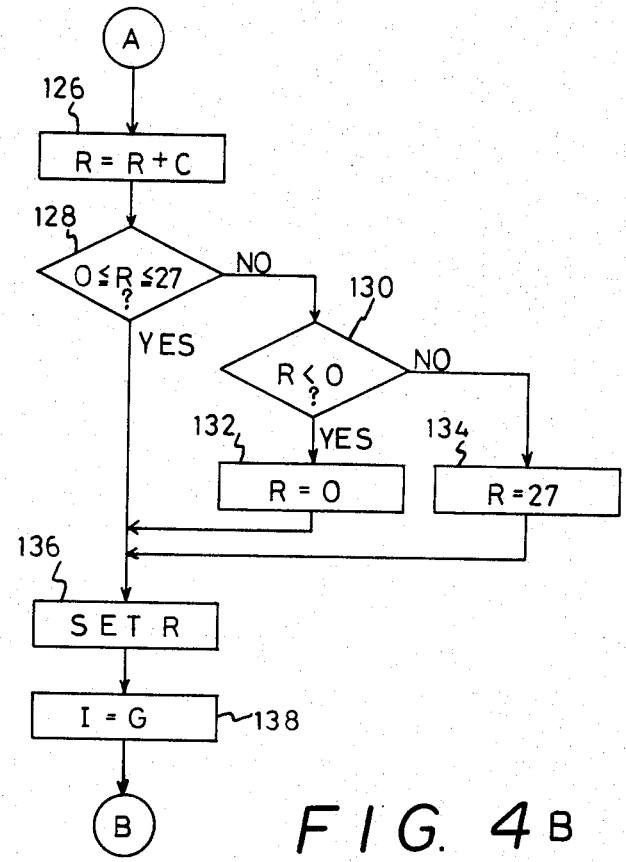
FIG. 3 shows a model of a part of contents of a ROM 14 used in FIG. 1.
FIGS. 4A and 4B show flow charts for explaining the present invention.

A part of the ROM 14 stores contents shown in FIG. 3. Information about an automatic sweep (AUTO) of the waveform memory apparatus 18 is stored at an address 0, set point information of a sweep speed 0.1 μs/cm is stored at an address 1, set point information of the sweep speed 20 s/cm is stored at an address 20, and set point information of an X-Y mode is stored at an address 27. Thus, twenty-eight set points can be controlled. When one address of the ROM 14 is selected by the microprocessor 12 and the switch 20, the corresponding set information is transferred to the waveform memory apparatus 18 via the bus 10 for controlling the sweep speed or the like of the apparatus 18.

The present invention will be described in detail by reference to flow charts of FIGS. 4A and 4B. The following steps are controlled by the microprocessor 12 in accordance with the program in the ROM 14.

STEP 102: After a power switch is turned on, the microprocessor 12 makes a level of an address line A0 "Low" to enable the buffer 22, and reads the on-off conditions of the switch contacts 20-0 through 20-3 via the buffer 22 and data lines D0 through D3. The read condition I (one of the four-bit words "0000" through "1111") is stored in the RAM 16. An initial value R (one of the addresses of the set information shown in FIG. 3, e.g., 0) is stored in the RAM 16, and the set information in the ROM 14 corresponding to the initial value R (address) is transferred to the apparatus 18 for controlling the set point. The initial contact condition I corresponds to the initial value R.

STEP 104: The microprocessor 12 detects a switch condition G of the switch 20 (one of the four-bit words "0000" through "1111") by making the address line A0 "Low" repeatedly, for example, every 30 ms, and stores the condition R in the RAM 16.

STEP 106: The microprocessor 12 compares the former switch condition I and the present switch condition G stored in the RAM 16. When they are equal to each other, STEP 104 is followed. When they are different from each other, STEP 108 is followed. According to this STEP 106, the switch contacts are checked whether or not they are operated.

STEP 108: The microprocessor 12 judges whether the condition value G is less than the condition value I or not, wherein the values G and I are stored in the RAM 16. If the value G is less than the value I, STEP 110 is followed. STEP 112 is followed if the value G is larger than the value I. (There is no case of G=I.)

STEP 110: The microprocessor 12 calculates "I−G" and obtains a result S (positive). After this step, STEP 114 is followed.

STEP 112: The microprocessor 12 calculates "G−I" and obtains the result S (positive). After this step, STEP 116 is followed.

STEP 114: The microprocessor 12 judges whether or not the S is larger than a half of the maximum word of the switch 20, namely, eight. If the S is equal to or less than eight, STEP 118 is selected. If the S is larger than eight, STEP 120 is selected.

STEP 116: The microprocessor 12 judges whether or not the S is larger than eight. If the S is larger than eight, STEP 122 is followed. If the S is equal to or less than eight, STEP 124 is followed.

The above-described STEPs 108 through 116 judge whether the movable contact 20-4 of FIG. 2 rotates clockwise (increasing the set point) or counterclockwise (decreasing the set point). The S is compared with eight in STEPs 114 and 116 on the assumption that it is impossible to rotate the movable contact 20-4 of the switch 20 by more a half rotation during the intervals between the switch condition detection processes in STEP 104 every 30 ms, i.e., it is impossible to change the contact condition by more eight. When the movable contact 20-4 rotates counterclockwise without passing through the switch contact conditions 0 and 15, $G<I$ and $S \leqq 8$, and also STEP 118 is followed via STEPs 110 and 114.

STEP 118: The microprocessor 12 sets a change value C to −S. Since the S is positive, the C is negative and represents that the set point is decreased.

When the movable contact 20-4 rotates clockwise through the contact conditions 15 and 0, $G<I$ and $S>8$, and also STEP 120 is followed via STEPs 110 and 114.

STEP 120: The microprocessor 12 sets the change value C to 16−S. The set point is increased within $7 \geqq C \geqq 1$ because of $16>S>8$.

When the movable contact 20-4 rotates counterclockwise through the contact conditions 0 and 15, STEP 122 is followed through STEPs 112 and 116 because of $G>I$ and $S>8$.

STEP 122: The microprocessor 12 sets the change value C to S−16. The C is negative because of $16>S>8$, and thereby decreasing the set point.

When the movable contact 20-4 rotates clockwise without passing through the contact conditions 15 and 0, STEP 124 is followed through STEPs 112 and 116 since $G>I$ and $S \leqq 8$.

STEP 124: The microprocessor 12 sets the change value C to S for increasing the set point.

After the processes of STEPs 118, 120, 122 and 124, STEP 126 is followed.

STEP 126: The microprocessor 12 adds the value C obtained in STEPs 118 through 124 to the value R stored in the RAM 16 for producing a new value R. In other words, the change value C is added to the address R of the former set point. After this step, STEP 128 is followed.

STEP 128: The microprocessor 12 judges whether or not the value R obtained in STEP 126 is equal to or larger than zero and is equal to or lower than twenty-seven. STEP 136 is selected if so, and STEP 130 is selected if not so. The address of the set information is between zero and twenty-seven as shown in FIG. 3, so that the R must be within this range.

STEP 130: The microprocessor 12 judges whether or not the R is negative. If the R is negative, STEP 132 follows. If the R is not negative, i.e., if the R is larger than twenty-seven, STEP 134 follows.

STEP 132: The R is set to zero (R=0) in the case that the R is negative, because the minimum address of the set information is zero. Even if the movable contact 20-4 further rotates counterclockwise after the R is set to zero, the R is kept to zero. STEP 136 is followed after this step.

STEP 134: Since the maximum address of the set information is twenty-seven, the R is set to twenty-seven (R=27) when the R is larger than 27. Even if the movable contact 20-4 further rotates clockwise after R is set to twenty-seven, the R is kept to twenty-seven. After this step, STEP 136 is followed.

STEP 136: The microprocessor 12 stores the R in the RAM 15, and reads the set information (FIG. 3) corresponding to the R from the ROM 14 for setting the sweep speed or the like of the apparatus 18. STEP 138 follows after this step.

STEP 138: The present contact condition G is regarded as the former contact condition I, and STEP 104 follows.

If the set point of the switch is controlled over 30 ms, the above-described steps are repeated.

Figure 4A:
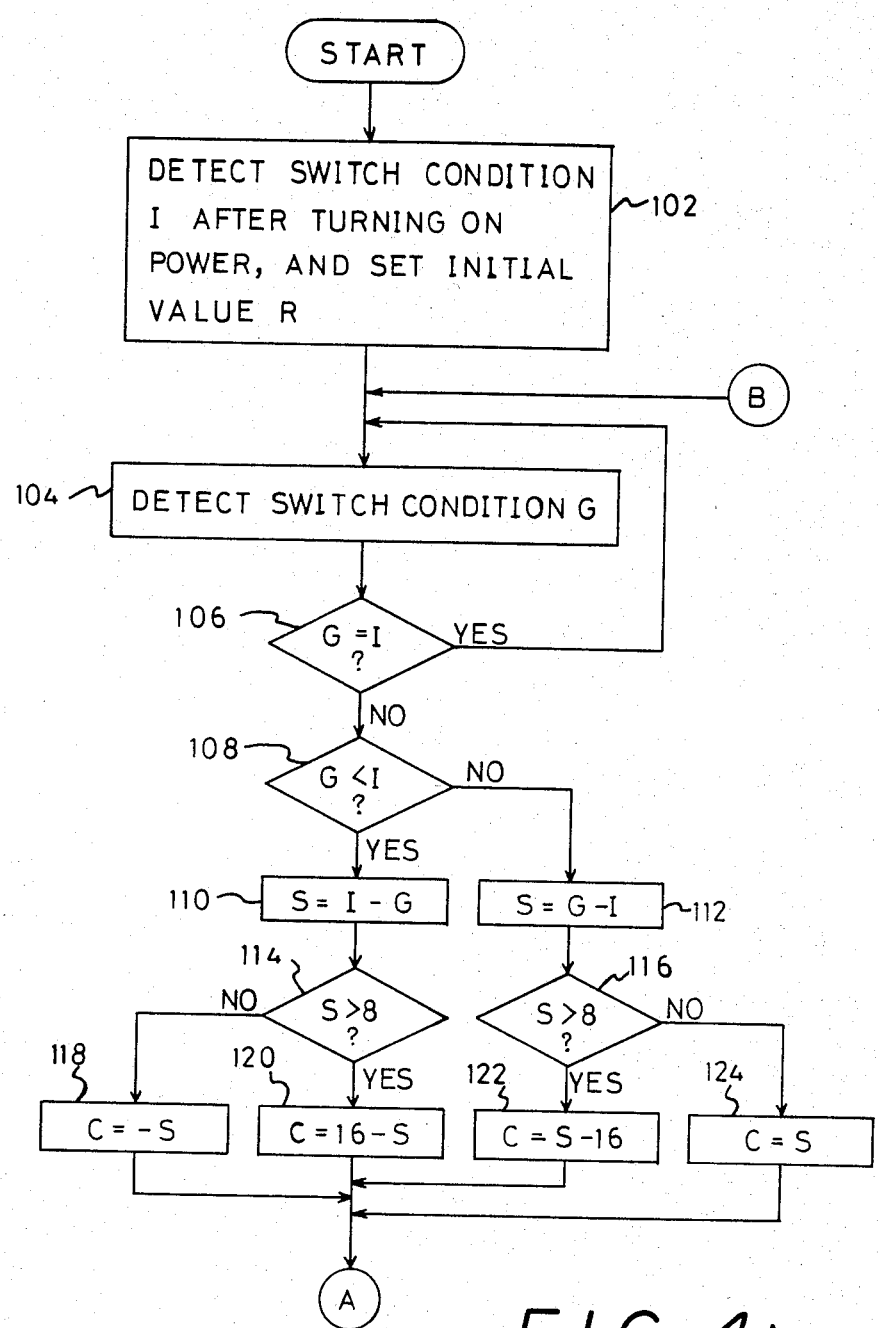

The software controlling the microprocessor 12 in the preferred embodiment described with respect to FIGS. 4A and 4B is shown in Appendix A. This software is the assembler of the Z80A.

As understood from the foregoing description, the present invention can control the set points of the electronic apparatus a number of which is larger than a number determined by the switch contact combinations, and the switch used in the invention may be simple and compact as well as inexpensive. Since it takes the microprocessor about 5 ms to process STEPs 104 through 138, the set point control task is not hard for the microprocessor and it can process other tasks, for example, controlling the electronic apparatus such as the waveform memory or the like. If the electronic apparatus includes the microprocessor, the ROM and the RAM, the present invention can be accomplished inexpensively.

While we have shown and described herein the preferred embodiment of our invention, it will be apparent to those skilled in the art that many changes and modifications may be made without departing from our invention in its broader aspects. For example, the switch may be any switch having a plurality of contacts such as a cam switch, a slide switch, etc. instead of the rotary switch shown in FIG. 2. A number of the switch contacts may not be four, and a number of the set points may be increased after considering the memory capacity of the ROM. In this instance, the number "8" in STEPs 114 and 116 and the number "16" in STEPs 120 and 122 are changed in accordance with a number of te switch contacts, and the number "27" in STEPs 128 and 134 is changed in accordance with a number of the set points. The present set point may be displayed on a CRT, a liquid crystal display, a LED display, etc. in response to the address R of the set information. A memory device for storing the value R may be a non-volatile memory or a memory with a backup function, so that the former set point may be set after a power switch is turned on. A memory device for storing the set information may be the non-volatile memory or the memory with the backup function instead of the mask ROM. In STEPs 114 and 116, the S may be judged to be equal to or larger than eight (S≧8) or not. Therefore, the scope of the present invention should be determined only by the following claims.

APPENDIX A

|  |  |  |
|---|---|---|
|  | GLOBAL | C$RET |
|  | GLOBAL | C$ENT |
|  | GLOBAL | ROT$ |
|  | GLOBAL | OKBBUFF$ |
|  | GLOBAL | NKBBUFF$ |
| ROT$ | CALL | C$ENT |
|  | LXI | H,-14 |
|  | DAD | SP |
|  | SPHL |  |
|  | LXI | H,-7 |
|  | DAD | D |
|  | PUSH | H |
|  | LXI | H,OKBBUFF$ |
|  | PUSH | H |
|  | LXI | H,4 |
|  | DAD | D |
|  | MOV | A,M |
|  | INX | H |

APPENDIX A-continued

| | |
|---|---|
| MOV | H,M |
| MOV | L,A |
| XTHL | |
| POP | B |
| DAD | B |
| MOV | A,M |
| MOV | C,A |
| SUB | A |
| MOV | B,A |
| MOV | A,C |
| ANI | 15 |
| MOV | C,A |
| MOV | A,B |
| ANI | 0 |
| MOV | B,A |
| POP | H |
| MOV | A,C |
| MOV | M,A |
| LXI | H,-8 |
| DAD | D |
| PUSH | H |
| LXI | H,NKBBUFF$ |
| PUSH | H |
| LXI | H,4 |
| DAD | D |
| MOV | A,M |
| INX | H |
| MOV | H,M |
| MOV | L,A |
| XTHL | |
| POP | B |
| DAD | B |
| MOV | A,M |
| MOV | C,A |
| SUB | A |
| MOV | B,A |
| MOV | A,C |
| ANI | 15 |
| MOV | C,A |
| MOV | A,B |
| ANI | 0 |
| MOV | B,A |
| POP | H |
| MOV | A,C |
| MOV | M,A |
| LXI | H,-7 |
| DAD | D |
| PUSH | H |
| LXI | H,-8 |
| DAD | D |
| POP | B |
| LDAX | B |
| CMP | M |
| JP | L1 |
| LXI | H,-10 |
| DAD | D |
| PUSH | H |
| LXI | H,-8 |
| DAD | D |
| MOV | A,M |
| MOV | C,A |
| SUB | A |
| MOV | B,A |
| PUSH | B |
| LXI | H,-7 |
| DAD | D |
| MOV | A,M |
| MOV | C,A |
| SUB | A |
| MOV | B,A |
| POP | H |
| MOV | A,L |
| SUB | C |
| MOV | L,A |
| MOV | A,H |
| SBB | B |
| MOV | H,A |
| POP | B |
| MOV | A,L |
| STAX | B |
| MOV | A,H |
| INX | B |

APPENDIX A-continued

|    |       |      |
|----|-------|------|
|    | STAX  | B    |
|    | DCX   | B    |
|    | MOV   | L,C  |
|    | MOV   | H,B  |
|    | MVI   | A,8  |
|    | SUB   | M    |
|    | MVI   | A,O  |
|    | INX   | H    |
|    | SBB   | M    |
|    | JP    | L3   |
|    | LXI   | H,-12 |
|    | DAD   | D    |
|    | PUSH  | H    |
|    | LXI   | H,16 |
|    | PUSH  | H    |
|    | LXI   | H,-10 |
|    | DAD   | D    |
|    | POP   | B    |
|    | MOV   | A,C  |
|    | SUB   | M    |
|    | MOV   | C,A  |
|    | MOV   | A,B  |
|    | INX   | H    |
|    | SBB   | M    |
|    | MOV   | B,A  |
|    | POP   | H    |
|    | MOV   | A,C  |
|    | MOV   | M,A  |
|    | MOV   | A,B  |
|    | INX   | H    |
|    | MOV   | M,A  |
|    | LXI   | H,-14 |
|    | DAD   | D    |
|    | PUSH  | H    |
|    | LXI   | H,O  |
|    | PUSH  | H    |
|    | LXI   | H,-12 |
|    | DAD   | D    |
|    | POP   | B    |
|    | MOV   | A,C  |
|    | SUB   | M    |
|    | MOV   | C,A  |
|    | MOV   | A,B  |
|    | INX   | H    |
|    | SBB   | M    |
|    | MOV   | B,A  |
|    | POP   | H    |
|    | MOV   | A,C  |
|    | MOV   | M,A  |
|    | MOV   | A,B  |
|    | INX   | H    |
|    | MOV   | M,A  |
|    | JMP   | L7   |
| L1 | LXI   | H,-10 |
|    | DAD   | D    |
|    | PUSH  | H    |
|    | LXI   | H,-7 |
|    | DAD   | D    |
|    | MOV   | A,M  |
|    | MOV   | C,A  |
|    | SUB   | A    |
|    | MOV   | B,A  |
|    | PUSH  | B    |
|    | LXI   | H,-8 |
|    | DAD   | D    |
|    | MOV   | A,M  |
|    | MOV   | C,A  |
|    | SUB   | A    |
|    | MOV   | B,A  |
|    | POP   | H    |
|    | MOV   | A,L  |
|    | SUB   | C    |
|    | MOV   | L,A  |
|    | MOV   | A,H  |
|    | SBB   | B    |
|    | MOV   | H,A  |
|    | POP   | B    |
|    | MOV   | A,L  |
|    | STAX  | B    |
|    | MOV   | A,H  |
|    | INX   | B    |
|    | STAX  | B    |

APPENDIX A-continued

|     |       |       |
|-----|-------|-------|
|     | DCX   | B     |
|     | LDAX  | B     |
|     | SUI   | 8     |
|     | INX   | B     |
|     | LDAX  | B     |
|     | SBI   | O     |
|     | JM    | L11   |
|     | LXI   | H,-12 |
|     | DAD   | D     |
|     | PUSH  | H     |
|     | LXI   | H,16  |
|     | PUSH  | H     |
|     | LXI   | H,-10 |
|     | DAD   | D     |
|     | POP   | B     |
|     | MOV   | A,C   |
|     | SUB   | M     |
|     | MOV   | C,A   |
|     | MOV   | A,B   |
|     | INX   | H     |
|     | SBB   | M     |
|     | MOV   | B,A   |
|     | POP   | H     |
|     | MOV   | A,C   |
|     | MOV   | M,A   |
|     | MOV   | A,B   |
|     | INX   | H     |
|     | MOV   | M,A   |
|     | LXI   | H,-14 |
|     | DAD   | D     |
|     | PUSH  | H     |
|     | LXI   | H,-12 |
|     | DAD   | D     |
|     | POP   | B     |
|     | MOV   | A,M   |
|     | STAX  | B     |
|     | INX   | H     |
|     | MOV   | A,M   |
|     | INX   | B     |
|     | STAX  | B     |
|     | JMP   | L7    |
| L3  | LXI   | H,-14 |
|     | DAD   | D     |
|     | PUSH  | H     |
|     | LXI   | H,-10 |
|     | DAD   | D     |
|     | POP   | B     |
|     | MOV   | A,M   |
|     | STAX  | B     |
|     | INX   | H     |
|     | MOV   | A,M   |
|     | INX   | B     |
|     | STAX  | B     |
|     | JMP   | L7    |
| L11 | LXI   | H,-14 |
|     | DAD   | D     |
|     | PUSH  | H     |
|     | LXI   | H,O   |
|     | PUSH  | H     |
|     | LXI   | H,-10 |
|     | DAD   | D     |
|     | POP   | B     |
|     | MOV   | A,C   |
|     | SUB   | M     |
|     | MOV   | C,A   |
|     | MOV   | A,B   |
|     | INX   | H     |
|     | SBB   | M     |
|     | MOV   | B,A   |
|     | POP   | H     |
|     | MOV   | A,C   |
|     | MOV   | M,A   |
|     | MOV   | A,B   |
|     | INX   | H     |
|     | MOV   | M,A   |
| L7  | LXI   | H,-14 |
|     | DAD   | D     |
|     | MOV   | A,M   |
|     | INX   | H     |
|     | MOV   | H,M   |
|     | MOV   | L,A   |
|     | MOV   | C,L   |

APPENDIX A-continued

| MOV | B,H |
| JMP | C$RET |

We claim:

1. In a method of controlling a set point with a rotary switch for generating sequentially a predetermined number of different digital words by a single rotation thereof, each of said digital words corresponding to zero or a positive number less than said predetermined number, the method comprising the steps of:

periodically detecting digital words from said rotary switch;

comparing a newly-detected first digital word with a previously-detected second digital word and obtaining the difference therebetween;

obtaining a change value according to the difference between said first digital word and said second digital word under any one of the following four conditions:

(1) when the first digital word is less than the second digital word, and said difference is less than one-half of said predetermined number, then the change value is equal to the negative of said difference;

(2) when the first digital word is less than the second digital word, and said difference is greater than one-half of said predetermined number, then the change value is equal to said predetermined number minus said difference;

(3) when the first digital word is greater than the second digital word, and said difference is greater than one-half of said predetermined number, then the change value is equal to said difference minus said predetermined number;

(4) when the first digital word is greater than the second digital word, and said difference is less than one-half of said predetermined number, then the change value is equal to said difference; and controlling the set point in accordance with said obtained change value.

2. A method in accordance with claim 1 wherein a presently obtained change value is added to a previous set-point control value to derive a new set-point control value.

3. A method in accordance with claim 2 wherein said new set-point control value is set to the maximum or minimum value of a predetermined control value range if said new set-point control value is outside of control value range.

* * * * *